United States Patent [19]

Takemoto et al.

[11] Patent Number: 5,220,587
[45] Date of Patent: Jun. 15, 1993

[54] OUTPUT CIRCUIT FOR A CCD WITH A D.C. RESTORATION CIRCUIT INTEGRATED TOGETHER WITH THE CCD IN A MONOLITHIC SEMICONDUCTOR CHIP

[75] Inventors: Iwao Takemoto, Hayano Mobara; Tatsuhisa Fujii, Cyubu Mobara; Atsushi Hasegawa, Hayano Mobara, all of Japan

[73] Assignee: Hitachi, Ltd., Tokyo, Japan

[21] Appl. No.: 799,142

[22] Filed: Nov. 27, 1991

[30] Foreign Application Priority Data

Nov. 28, 1990 [JP] Japan ................... 2-326348

[51] Int. Cl.⁵ ............................ H03K 3/353
[52] U.S. Cl. .......................... 377/57; 377/58; 377/60; 377/63
[58] Field of Search ............... 377/57, 58, 60, 63

[56] References Cited

U.S. PATENT DOCUMENTS 4,355,244 10/1982 Benoit-Gonin et al. .......... 377/60
4,503,550 3/1985 Sauer ............................. 377/63

Primary Examiner—William L. Sikes
Assistant Examiner—Scott A. Ouellette
Attorney, Agent, or Firm—Antonelli, Terry, Stout & Kraus

[57] ABSTRACT

An amplification MOSFET in a source ground form receives at its gate an output signal of a source-follower circuit through a second capacitor. The source-follower circuit, on the otherhand, receives a voltage of a first capacitor which receives a signal charge. A predetermined bias voltage is supplied to the gate of the amplification MOSFET through a switch device while the signal charge of the first capacitor is reset. According to this structure, the second capacitor can transmit only the signal component and the voltage signal itself can be amplified by the source ground type amplification MOSFET. The amplification MOSFET can be biased to its optimum operation point by the switch device during the reset period of the first capacitor; hence, sensitivity can be substantially improved with a simple circuit structure.

9 Claims, 3 Drawing Sheets

OUTPUT CIRCUIT FOR A CCD WITH A D.C. RESTORATION CIRCUIT INTEGRATED TOGETHER WITH THE CCD IN A MONOLITHIC SEMICONDUCTOR CHIP

BACKGROUND OF THE INVENTION

1. Field of the Invention

This invention relates to an amplification circuit and to a technique which will be effective when utilized for an amplification output circuit for a CCD (Charge Coupled Device), for example.

2. Description of the Prior Art

A circuit such as shown in FIG. 6 of the accompanying drawings has been used as an amplification circuit for a CCD. A signal charge is transferred by the CCD to an output diffusion layer (which is expressed structurally equivalently in the form of a diode D), and is converted to the form of a signal voltage by a capacitor C1 consisting of its junction capacitance. This signal voltage is outputted through a source-follower circuit consisting of an amplification MOSFET Q2 and a load MOSFET Q3. Such an amplification circuit is referred to as an FDA (Floating Diffusion Amplifier). The MOSFET Q1 has the signal charge retained in the capacitor C1 reset by a reset pulse $\phi R$ at a reference voltage VR when the signal voltage corresponding to the signal charge is amplified and outputted or in other words, before a next signal charge is transferred.

Such an FDA is described, for example, in "CCD Camera Technique", page 64, published by Radio Kijutsusha, Nov. 3, 1986.

The sensitivity of the FDA described above is given by the product (As/Cl) of the capacitance value of the capacitor C1 inclusive of the parasitic capacitance in the reset MOSFET Q1 and in the amplification MOSFET Q2 and the gain (As<1) of the source-follower circuit. The improvement of the gain As is limited by the relation As<1. Therefore, the improvement of the sensitivity of the FDA depends on how much the capacitance value of the capacitor C1 can be reduced. In the conventional FDAS, therefore, great efforts have been made to miniaturize the diode D1 and the amplification MOSFET in order to reduce the capacitance value of the capacitor C1. If the size of the amplification MOSFET Q2 is reduced, however, the output current essentially becomes smaller, and there occurs the contradictory problem that the load driving capacity of a post stage circuit is lost. Therefore, it has been customary to cascade a plurality of source-follower circuits so as to make up for insufficiency of the driving capacity of the initial stage circuit.

In the FDAs available at present, the capacitance value of the capacitor C1 described above has come to below $10^{-14}$ F and the voltage sensitivity has exceeded 10 microvolt per electron. From the aspect of application, however, the number of electrons handled per signal is at most some dozens and a further increase of the output signal amplitude has been desired. The real sensitivity is determined by an S/N (signal-to-noise ratio) and in order to improve this S/N, reduction of thermal noise that occurs at random is particularly indispensable.

The thermal noise occurring in the CCD itself has been reduced remarkably and the thermal noise in a CCD imaging device is determined by the thermal noise generated in the FDA. The principal components of the noise in the FDA are the reset noise of the capacitor C1 and the 1/f noise of the amplification MOSFET Q2. The reset noise is proportional to the square of the capacitor C1, and decreases with the reduction of its size, whereas the 1/f noise is substantially in inverse proportion to the reduction of the size, on the contrary.

Since such a random noise is contained in both of the dark output (reset voltage) and the bright output (signal charge output), it can be offset by obtaining the difference by a correlational double sampling (CDS) circuit and generating a signal. However, there is a limit to the noise reduction by the CDS circuit because the distortion of waveforms up to the CDS circuit and the disturbance of the waveforms due to various jump in pulses resulting from the extension of wirings, and so forth, exist.

It is therefore an object of the present invention to provide an amplification circuit which can accomplish a high sensitivity with a simple circuit structure.

It is another object of the present invention to provide a high sensitivity amplification circuit which will be suitable for a CCD.

These and other objects and novel features of the present invention will become more apparent from the following description of this specification when taken in conjunction with the accompanying drawings.

SUMMARY OF THE INVENTION

The following will represent a typical example of the invention disclosed in the present application.

An amplification MOSFET of a source-earth type which receives at its gate an output signal from a source-follower circuit for receiving a voltage of a first capacitor for receiving a signal charge, through a second capacitor, is disposed for the source follower circuit, and a predetermined bias voltage is applied to the gate of the amplification MOSFET through a switch device during the period in which the signal charge of the first capacitor is reset.

According to the means described above, only the signal component can be transmitted by the second capacitor and the source ground type amplification MOSFET can amplify the voltage signal itself. Since the amplification MOSFET can be biased to its optimum operation point by the switch device during the reset period of the first capacitor, substantially high sensitivity can be attained with a simple circuit structure.

DESCRIPTION OF THE PREFERRED EMBODIMENTS

Figure 1:
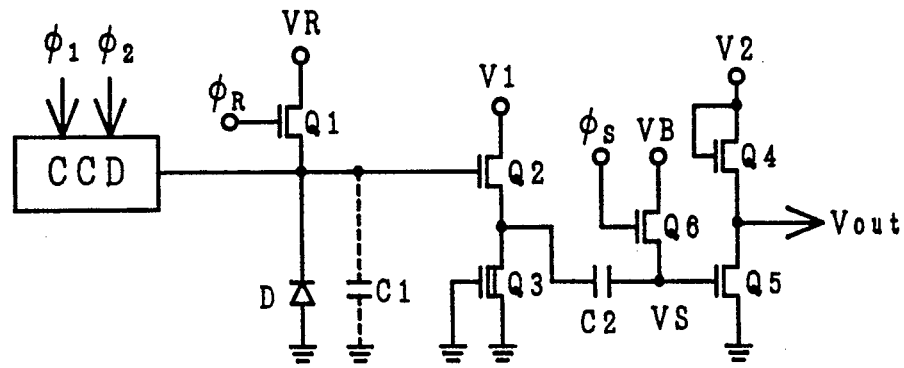
FIG. 1 is a circuit diagram showing an embodiment of an amplification circuit of the present invention.

FIG. 1 shows a circuit diagram of an embodiment of the amplification circuit according to the present invention. Each of the circuit devices shown in the diagram is formed on one semiconductor substrate such as a single crystal silicon with other devices constituting a CCD solid-state imaging device by a known fabrication technique of semiconductor integrated circuitry, though this arrangement is not intended to be particularly limiting to present invention.

The signal charge that is transferred by transfer pulses $\phi 1$ and $\phi 2$ through a CCD transfer circuit is inputted to an output diffusion layer which is expressed equivalently in the form of a diode D. The inputted signal charge is converted to a voltage signal by a capacitor C1 consisting of the P-N junction capacitance of this output diffusion layer and the parasitic capacitance in a reset MOSFET Q1 and an amplification MOSFET Q2. The voltage signal of this capacitor C1 is power amplified by a source-follower circuit consisting of the amplification MOSFET Q2 and a load MOSFET Q3. This load MOSFET Q3 consists of a depletion type MOSFET, and functions as a constant current load because its gate and source are used in common.

In this embodiment, the voltage signal, which is power amplified by the source-follower circuit, is transmitted to the gate of a source ground type amplification MOSFET Q5 in order to voltage amplify the signal. In this case, a capacitor C2 operating as a coupling capacitance is disposed between the output of the source-follower circuit and the gate of the source ground type amplification MOSFET Q5 in order to set the operation point of the source ground type amplification MOSFET Q5 to an optimum point irrespective of the D.C. voltage contained in the voltage signal of the source-follower circuit. A bias voltage VG is intermittently applied to the gate of the amplification MOSFET Q5 through a switch MOSFET Q6. In other words, a timing pulse $\phi s$ is supplied to the gate of this switch MOSFET Q6, and this MOSFET Q6 is turned ON in substantial synchronism with the timing at which the output diffusion layer (capacitor C1) is reset as will be later described, or in other words, during the period other than the output period of the signal charge. In this way, the switch MOSFET Q6 supplies the bias voltage VB to the gate of the source ground amplification MOSFET Q5.

Though not particularly limitative, a load MOSFET Q4 whose gate and drain are connected in common to each other is connected to the drain of the source ground type amplification MOSFET Q5. The voltage signal VS supplied to the gate of the amplification MOSFET Q5 is voltage amplified in accordance with a conductance ratio between these amplification MOSFETs Q4 and Q5, and is outputted as an output signal Vout.

The reason why the output of the source-follower circuit and the input of the inversion amplification circuit using the source ground type amplification MOSFET Q5 are separated D.C.-wise through the capacitor C2 is as follows.

If the output of the source-follower output circuit is directly connected to the input of the inversion amplification circuit, the operation point of the inversion amplification circuit will go out of harmony. To efficiently extract the signal charge while maintaining CCD performance, the output diffusion layer (N layer) must be reset to a high voltage VR of about 10 V or higher. Therefore, the output voltage of the source-follower circuit drops with a voltage, whose voltage level is lower by the threshold voltage of the source-follower amplification MOSFET Q2 than the voltage VR, as a reference. Therefore, it may be possible to reduce the voltage level inputted by the inversion amplification circuit by increasing the threshold voltage of the source-follower amplification MOSFET Q2. If this circuit arrangement is used, however, the characteristics of the source-follower amplification MOSFET Q2 will become deteriorated under the operation condition where the output voltage becomes about less than half of the power supply voltage V1.

On the other hand, if the voltage gain of the output voltage Vout is set to 5 times in the inversion amplification circuit, for example, the output voltage becomes below 1/6 times the power supply voltage V2. Quite naturally, the gate voltage VS of the source-earth type amplification MOSFET Q5 must be below the value described above. In this point, too, it is theoretically possible to increase the operation point to about the half of the power supply voltage V2 by increasing extremely the threshold voltage of the source-ground type amplification MOSFET Q5, but such a circuit arrangement is not preferable from the aspect of MOSFET characteristics. Needless to say, the source-follower amplification MOSFET Q2, or the like, is fabricated as finely as possible so as to obtain higher sensitivity, and its output voltage is likely to remarkably fluctuate with its fabrication variance. It is by no means a rare case that the output voltage fluctuates by 1 V or more from device to device. In contrast, since the voltage gain of the inversion amplification circuit is great, the dynamic range of its input is so narrow that it is difficult to offset the variance described above.

Furthermore, if the source-follower circuit and the inversion amplification circuit are directly connected to each other as described above, a feed-component (the drop of the voltage signal in the capacitor C1) available when the reset MOSFET Q1 is turned OFF by changing the reset pulse $\phi R$ from the high level to the low level is amplified, too, by the inversion amplification circuit, so that the voltage range that can be used for the signal component is narrowed. The amplification circuit also amplifies the thermal noise. Accordingly, there are so many problems that this circuit structure cannot be put into practical application.

Accordingly, this embodiment separates D.C.-wise the output of the source-follower circuit from the input of the inversion amplification circuit using the source-ground type amplification MOSFET Q5 through the capacitor C2 as described above, and lets these two amplification circuits operate under their optimum conditions, respectively.

In other words, the output diffusion layer (N layer) is reset to the high voltage VR above about 10 V and a relatively high level voltage signal corresponding to this voltage is outputted on the source-follower circuit side in order to efficiently extract the signal charge while keeping CCD performance. In contrast, the switch MOSFET Q6 is disposed on the inversion amplification circuit side so as to supply the bias voltage VB to the gate of the source-earth amplification-MOSFET Q5 under the optimum operation condition.

Figure 4:
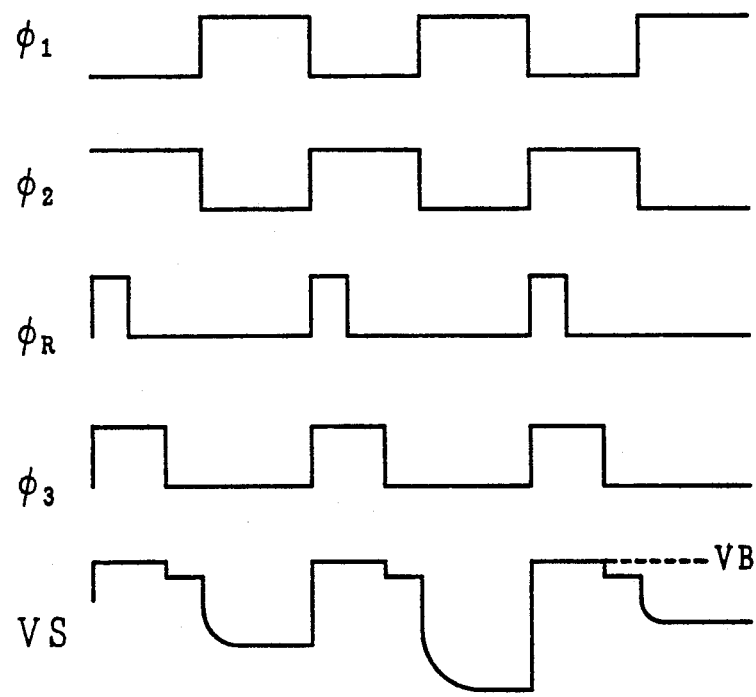
FIG. 4 is a waveform diagram useful for explaining an example of the operation of the amplification circuit.

The operation of the amplification circuit of this embodiment will be explained with reference to the waveform diagram shown in FIG. 4.

When the transfer pulse $\phi 1$ is at the low level and the transfer pulse $\phi 2$ is at the high level, the signal charge is not outputted from the CCD to the output diffusion layer (capacitor C1). At this time, both of the reset pulse $\phi R$ and the timing pulse $\phi s$ are set to the high level. The reset MOSFET Q1 is turned ON in response to the high level of the reset pulse $\phi R$ and provides the reset voltage VR to the output diffusion layer (capacitor C1). The switch MOSFET Q6 is turned ON in response to the high level of the timing pulse $\phi s$ and provides the bias voltage VB to the gate of the amplification MOSFET Q5 of the inversion amplification circuit. Under this state, the source-follower circuit outputs the dark output voltage corresponding to the reset voltage VR but the input of the inversion amplification circuit is fixed to the bias voltage VB described above as represented by VS. Accordingly, a D.C. voltage corresponding to the difference voltage between the two D.C. voltages applied across the capacitor C2 is accumulated in this capacitor C2.

When the reset pulse $\phi R$ changes from the high level to the low level, the switch MOSFET Q1 changes from the ON state to the OFF state, and the output diffusion layer (capacitor C1) keeps the reset voltage VR under the floating state. The holding voltage drops to a certain extent due to the feed-through component at the time of the change of the reset MOSFET Q1 from the ON state to the OFF state. At this timing, however, the timing pulse $\phi s$ keeps the high level state and keeps the switch MOSFET Q6 ON. Accordingly, the inversion amplification circuit does not substantially accept the feed-through component occurring at the time of the change of the reset MOSFET Q1 from the ON state to the OFF state. Next, the timing pulse $\phi s$ changes to the low level and the switch MOSFET Q6 is turned OFF. Feed-through similarly occurs in this case as described above, but the impedance of the gate node of the source-earth type amplification MOSFET Q5 is determined by the capacitor C2 and by the load MOSFET Q3 and becomes hundred times smaller than in the case of the output diffusion layer, so that the potential change due to feed-through becomes smaller in proportion to the feed-through described above and can be neglected from the aspect of practical application.

Accordingly, during the period in which the transfer pulse $\phi 1$ is at the high level and the transfer pulse $\phi 2$ is at the low level, the voltage corresponding to the signal charge inputted from the CCD to the output diffusion layer is transmitted to the inversion amplification circuit through the source follower circuit and the capacitor C2, and is outputted as the voltage signal output Vout. In this instance, the difference between the dark output by the capacitor C2 and the bright output corresponding to the signal charge is amplified by the inversion amplification circuit, and the circuit operation equivalent to that of the CDS circuit is thus exhibited. In this embodiment, the thermal noise generated in the source-follower circuit is eliminated and the output is voltage amplified by the inversion amplification circuit. In this way, it is possible to obtain a voltage signal Vout having a high S/N and moreover, a high voltage amplitude. The amplification circuit of this embodiment provides the advantage that the influences of the waveform distortion up to the CDS circuit and waveform disturbance resulting from various jump-in pulses due to extension of wirings can be eliminated in comparison with the case where the difference between the dark output and the bright output is likewise obtained by the correlational double sampling (CDS) circuit disposed outside.

Even if any D.C.-like change of the voltage signal occurs due to the change of the threshold voltage resulting from fabrication variance when the source-follower MOSFET Q2 is miniaturized in order to obtain a higher sensitivity of the source-follower circuit, the capacitor C2 offsets such a change. Accordingly, the inversion amplification circuit is not affected by this change but can perform a stable voltage amplification operation at the optimum operation point which is set by the bias voltage VB.

Figure 2:
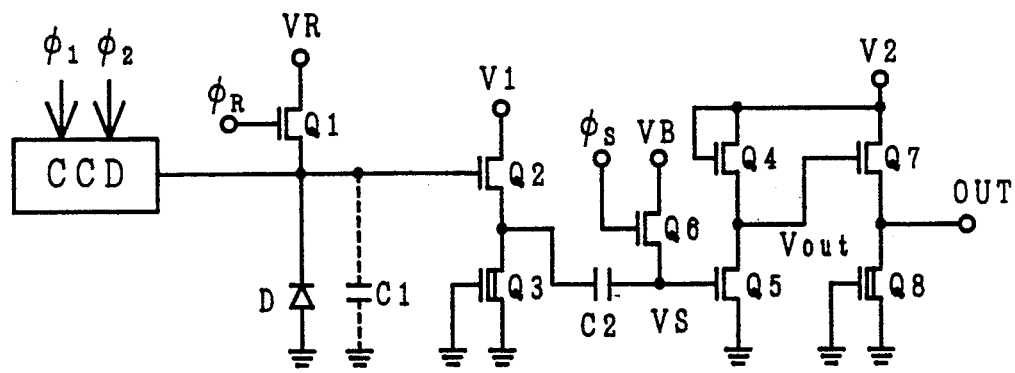
FIG. 2 is a circuit diagram showing another embodiment of the amplification circuit of the present invention.

FIG. 2 shows another embodiment of the amplification circuit according to the present invention.

Figure 3:
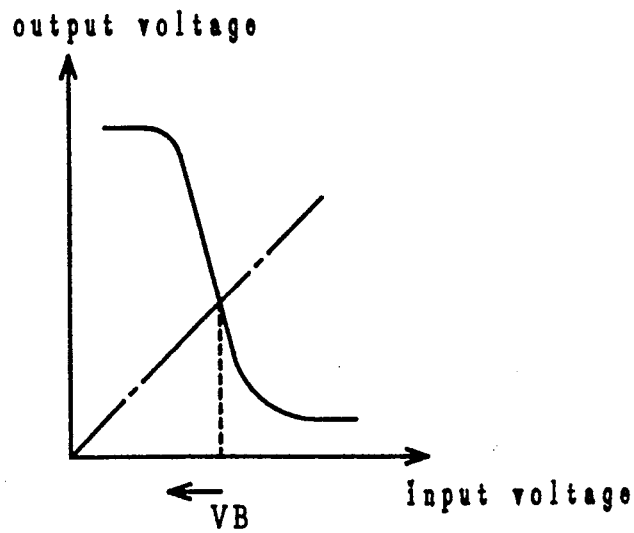
FIG. 3 is an input/output transmission characteristic diagram useful for explaining the operation point in an inverse amplification circuit used for the amplification circuit described above.

In this embodiment, the switch MOSFET Q6 is disposed between the input and output of the inversion amplification circuit or in other words, between the gate and drain of the source-earth amplification MOSFET Q5. When the input and output of the inversion amplification circuit are thus short-circuited, the bias voltage VB can be set to the point of intersection between the input-output transmission characteristics curve shown in FIG. 3 and a straight line represented by one-dot-chain line on which the input voltage and the output voltage become equal to each other. In this way, bias setting can be always made under the optimum condition in spite of any process variance of the MOSFETs Q4 and Q5 without requiring any special bias power supply, in particular. In other words, when the amplification MOSFET Q5 is of an enhancement type having an ordinary low threshold voltage, the upper limit of the gate voltage under the operation condition providing high linearity in the inverse amplification circuit using such an MOSFET is the drain voltage of the amplification MOSFET Q5, and since the input voltage is negative (the negative voltage using the dark voltage as the reference), the portion having the best linearity among the input-output transmission characteristics shown in FIG. 3 can be utilized, and the voltage automatically returns to the bias voltage VB described above when the switch MOSFET Q6 is turned ON. When the enhancement type MOSFET Q4 similar to the amplification MOSFET Q5 having the gate and drain thereof connected is used as the load means, its conductance ratio with the amplification MOSFET Q5 which is biased by short-circuiting its gate and drain can be set with a high level of accuracy corresponding to the size ratio. Accordingly, the amplification operation having high linearity becomes possible.

The circuit which determines the bias voltage VB by short-circuiting the input and output of the inversion amplification circuit also provides the following advantage.

When a large signal charge is outputted in the conventional FDA, the voltage change width of the source-follower output voltage is great when the output diffusion layer is reset by the reset pulse $\phi R$. Accordingly, the restoration time or in other words, the time necessary for resetting, gets longer. This involves the following problem. With the increase in the number of pixels in a solid-state imaging device, a read cycle of the signals must be increased. With the increase in the number of pixels, a higher sensitivity becomes more and more necessary and the size of the source-follower amplification MOSFET Q2 becomes smaller and smaller. Accordingly, the current supply capacity of the MOSFET Q2 becomes smaller and charge-up of the parasitic capacitance at the source output is effected by the difference between the current of this MOSFET Q2 and the current flowing through the load MOSFET Q3, and its restoration needs a long time. In contrast, if the capacitor C2 described above is disposed and the switch MOSFET Q6 is turned ON by bringing the timing pulse φs to the high level in synchronism with the reset pulse φR, the input voltage VS of the inversion amplification circuit is quickly raised by a kind of the amplification operations of the bias voltage or of the inversion amplification circuit. This voltage rise so operates as to promote the recovery of the source potential of the source-follower amplification MOSFET Q2 through the capacitor C2, and the reset restoration time of the circuit can be shortened. Accordingly, it becomes possible to obtain an amplification circuit suitable for the increased number of pixels of the CCD solid-state imaging device and its higher speed operation.

In the embodiment shown in FIG. 2, a source-follower output circuit consisting of the source-follower amplification MOSFET Q7 and a load resistor Q8 is disposed at the output portion.

Figure 5:
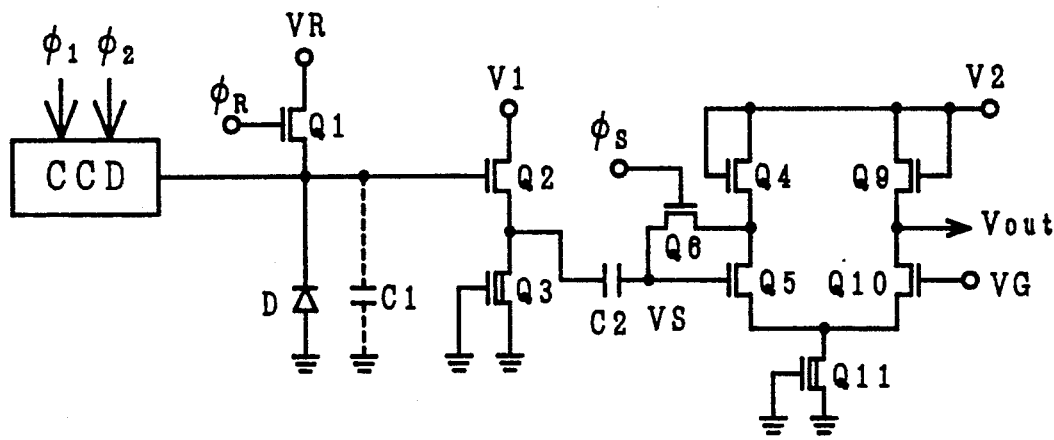
FIG. 5 is a circuit diagram showing still another embodiment of the amplification circuit of the present invention.
Figure 6:
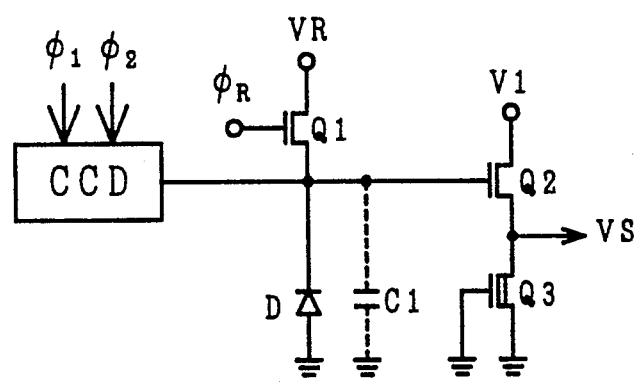
FIG. 6 is a circuit diagram useful for explaining an example of the prior art.

FIG. 5 shows still another embodiment of the amplification circuit according to the present invention.

This embodiment obtains the output voltage by the use of the differential circuit. In other words, the MOSFET Q11 functioning as the constant current source is connected to the source of the source ground amplification MOSFET Q5 constituting the inversion amplification circuit in the same way as described above, and the inversion amplification circuit consisting of the amplification MOSFET Q10 and the MOSFET Q9 as its drain load is disposed differentially with respect to the MOSFET Q5. A predetermined gate bias voltage VG is applied to the gate of the amplification MOSFET Q10 described above.

In this embodiment, the amplification MOSFET Q5 and the amplification MOSFET Q10 are connected in the differential form and the amplification MOSFET Q10 substantially functions as the grounded-gate source input type amplification MOSFET. Accordingly, the output voltage Vout can form the output signal having the same phase negative polarity as the output signal (VS) of the source-follower circuit.

The functions and effects obtained from the embodiments given above are as follows.

(1) The amplification MOSFET in the source ground form which receives the output signal of the source follower circuit through the second capacitor at its gate is disposed for the source-follower circuit which receives the voltage of the first capacitor receiving the signal charge. A predetermined bias voltage is supplied to the gate of the amplification MOSFET through the switch device while the signal charge of the first capacitor is reset. This circuit structure can transmit only the signal component by the second capacitor, can amplify the voltage signal itself by the source ground amplification MOSFET and can bias the amplification MOSFET to the optimum operation point by the switch device during the reset period of the first capacitor. Accordingly, the sensitivity can be substantially improved with a simple structure.

(2) The difference between the dark output and the bright output is amplified by the inversion amplification circuit through the second capacitor, and hence, only the signal charge component after thermal noise has been offset can be amplified. Accordingly, the S/N ratio can be improved, or, in other words, a higher sensitivity can be substantially accomplished.

(3) Due to the above item (2), the influences of the waveform distortion up to the external correlational double sampling (CDS) circuit and the disturbance of waveform due to various jump-in pulses resulting from the extension of wirings can be reduced in comparison with the prior art where the difference between the dark output and the bright output is obtained by the correlational double sampling (CDS) circuit disposed outside. Accordingly, a higher S/N, can be obtained, or, in other words, a higher sensitivity can be accomplished.

(4) The switch device is disposed between the gate and drain of the source-ground amplification MOSFET described above so as to set the bias voltage. Accordingly, bias setting can be made under an optimum condition with a simple structure independently of variations in the input/output transmission characteristics of the inversion amplification circuit.

(5) The load MOSFET whose gate is connected to its drain is disposed at the drain of the amplification MOSFET in order to constitute the inversion amplification circuit. Since these two MOSFETs are allowed to operate under the same condition in this way, the voltage gain proportional to the device size can be obtained stably.

(6) The capacitor C2 is disposed between the source-follower circuit and the input of the inversion amplification circuit to transmit the signal. Since resetting of the source-follower circuit can thus be made at a high speed at the time of resetting, high speed read-out can be made.

Although the present invention has thus been explained definitely with reference to the preferred embodiments thereof, the present invention is not particularly limited thereto but can of course be changed or modified in various ways without departing from the scope thereof. For example, a plurality of source-follower circuits may be cascaded in a plurality of stages. Similarly, inversion amplification circuits may be cascaded in a plurality of stages. Besides the MOSFETs, suitable resistance devices may be used as the load of the inversion amplification circuit. This also holds true of the load of the source-follower circuit. The same pulse may be used for both of the reset pulse φR and the timing pulse φs. In this case, the transfer pulse φs2 may be used for each of the two pulses φR and φs.

The amplification circuit of the present invention can be applied to a weak light monitor device or optical sensor device consisting of a photo-diode for merely forming a signal charge in accordance with a light reception quantity and an amplification circuit for amplifying the signal charge, besides the CCD solid-state imaging device constituting a line sensor or an area sensor. In other words, the amplification circuit of the present invention can be utilized widely for those circuits which amplify a very small signal charge and output the amplified signal charge.

The effect brought forth by the typical invention among those disclosed in this application is briefly as follows. The source-ground type amplification MOSFET which receives at its gate the output signal of the source-follower circuit through the second capacitor is disposed for the source-follower circuit receiving the voltage of the first capacitor which in turn receives the signal charge, and a predetermined bias voltage is supplied to the gate of the amplification MOSFET through the switch device during the period in which the signal charge of the first capacitor is reset. In accordance with this circuit structure, only the signal component can be transmitted by the second capacitor and the voltage signal itself can be amplified by the source-ground amplification MOSFET, and, at the same time, the amplification MOSFET can be biased to an optimum operation point by the switch device during the reset period of the first capacitor. Accordingly, a high sensitivity can be obtained with a simple circuit structure.

We claim:

1. An amplification circuit including:
   a first capacitor for receiving a signal charge;
   a source-follower circuit for receiving a voltage of said first capacitor;
   an amplification MOSFET in a source-ground form, for receiving and output signal of said source-follower circuit at a gate thereof through a second capacitor; and
   means for supplying a predetermined bias voltage to the gate of said amplification MOSFET during a period in which the signal charge of said first capacitor is reset;
   wherein an amplification output signal corresponding to the signal charge is obtained from a drain of said amplification MOSFET.

2. An amplification circuit according to claim 1 further comprising a load MOSFET coupled to the drain of said amplification MOSFET, wherein a drain and a gate of said load MOSFET are connected to each other.

3. An amplification circuit according to claim 1, wherein said signal charge is inputted through a charge coupled device.

4. An amplification circuit according to claim 2, wherein said signal charge is inputted through a charge coupled device.

5. An amplification circuit including:
   a first capacitor for receiving a signal charge;
   a source follower circuit for receiving a voltage of said first capacitor;
   a second capacitor for electrically connecting and source follower circuit and an input node of an amplification means wherein the amplification means is coupled to receive an output signal of said course follower circuit through said capacitor; and
   a bias supplying means for supplying a predetermined bias voltage to said amplification means wherein said amplification means comprises a differential circuit having first and second input terminals, wherein said first input terminal receives said output signal of said source follower circuit and wherein said second input terminal receives a constant voltage, and wherein an output signal of the amplification circuit is output from an output terminal of said differential circuit.

6. An amplification circuit according to claim 5, wherein
   said amplification means comprises a metal-oxide semiconductor transistor, and
   a gate electrode and a drain electrode of said metal-oxide semiconductor transistor are electrically connected by said bias supplying means.

7. An amplification circuit according to claim 5, wherein
   said amplification means comprises a metal-oxide semiconductor transistor and a constant current source electrically connected to a source of said metal-oxide semiconductor transistor.

8. An amplification circuit according to claim 6, wherein
   said amplification means comprises a constant current source electrically connected to a source of said metal-oxide semiconductor transistor.

9. An amplification circuit according to claim 8, wherein said signal charge is inputted through a charge coupled device.

* * * * *